United States Patent [19]

Ebinuma et al.

[11] Patent Number: 5,917,580
[45] Date of Patent: Jun. 29, 1999

[54] SCAN EXPOSURE METHOD AND APPARATUS

[75] Inventors: Ryuichi Ebinuma, Tokyo; Tosiya Asano, Utsunomiya, both of Japan

[73] Assignee: Canon Kabushiki Kaisha, Tokyo, Japan

[21] Appl. No.: 08/919,289

[22] Filed: Aug. 28, 1997

[30] Foreign Application Priority Data

Aug. 29, 1996 [JP] Japan .................................. 8-245449
Sep. 25, 1996 [JP] Japan .................................. 8-272884

[51] Int. Cl.$^6$ ........................... G03B 27/42; G03B 27/54
[52] U.S. Cl. ................................................ 355/53; 355/67
[58] Field of Search ................................. 355/40, 53, 67, 355/77, 55; 356/399, 400, 401; 250/548

[56] References Cited

U.S. PATENT DOCUMENTS

| | | | |
|---|---|---|---|
| 4,558,949 | 12/1985 | Uehara et al. | 356/152 |
| 4,650,983 | 3/1987 | Suwa | 250/204 |
| 5,112,133 | 5/1992 | Kurosawa et al. | 356/401 |
| 5,150,391 | 9/1992 | Ebinuma et al. | 378/34 |
| 5,317,615 | 5/1994 | Ebinuma et al. | 378/34 |
| 5,377,251 | 12/1994 | Mizusawa et al. | 378/34 |
| 5,602,399 | 2/1997 | Mitzutani | 250/548 |
| 5,661,548 | 8/1997 | Iami | 355/55 |
| 5,710,620 | 1/1998 | Taniguchi | 355/53 |
| 5,721,607 | 2/1998 | Ota | 355/53 |
| 5,721,608 | 2/1998 | Taniguchi | 355/53 |
| 5,734,462 | 3/1998 | Sakai | 355/53 |

*Primary Examiner*—Eddie C. Lee
*Assistant Examiner*—Hung Henry Nguyen
*Attorney, Agent, or Firm*—Fitzpatrick, Cella, Harper & Scinto

[57] ABSTRACT

A scan type exposure method and apparatus in which a projection optical system projects, at a projection station, a portion of a pattern of an original onto a region on a substrate, an original stage moves the original relative to the projection optical system in an original scanning direction, a first substrate stage moves the substrate relative to the projection optical system in a substrate scanning direction, a second substrate stage moves the substrate relative to the projection optical system in an optical axis direction of the projection optical system, a synchronism controller controls, in the projection of the original onto the substrate through the projection optical system, synchronism between the movement of the original stage in the original scanning direction and the movement of the first substrate stage in the substrate scanning direction, a measuring device measures a position of the surface of the substrate with respect to the optical axis direction at a measurement point spaced from the projection station of and a stage controller controls, in the control of the synchronism between the movement of the original stage and the movement of the first substrate stage through the synchronism controller, movement of the substrate stage through the second substrate stage on the basis of a measured value of the measuring device and of a correction value for correcting an error produced with movement of the first substrate stage from the measurement point to the projection station over a portion of the substrate to be measured.

20 Claims, 9 Drawing Sheets

SCAN EXPOSURE METHOD AND APPARATUS

FIELD OF THE INVENTION AND RELATED ART

This invention relates to an exposure apparatus for use in the manufacture of semiconductor devices, for example, for printing a design pattern onto a resist material on a substrate, and also to a device manufacturing method using such an exposure apparatus.

In an exposure apparatus of a simultaneous exposure method, if a projection optical system is provided by lenses, the imaging region thereof has an a arcuate shape. However, since a semiconductor integrated circuit is generally of a rectangular shape, the transfer region in the case of a simultaneous exposure method has to be of a rectangular shape inscribed with a circular imaging region of the projection optical system. Thus, even the largest transfer region is of a square shape with a side $1/\sqrt{2}$ of the diameter of the circle.

On the other hand, there has been proposed a scan exposure method (step-and-scan method) wherein a slit-like exposure region of a size approximately corresponding to the diameter of a circular imaging region of a projection optical system is used and wherein a reticle and a wafer are scanningly moved in synchronism with each other, whereby the transfer region is enlarged. In this method, with a projection optical system having an imaging region of the same size, a larger transfer region can be attained as compared with the step-and-repeat method wherein, for each pattern transfer region, simultaneous exposure is performed by use of a projection lens. More specifically, with respect to the scan direction, there is no limitation by the optical system and, therefore, a transfer region corresponding to the stroke of the stage can be provided. Also, with respect to a direction perpendicular to the scan direction, a transfer region of about $\sqrt{2}$ times larger can be provided.

In exposure apparatuses for the manufacture of semiconductor integrated circuits, enlargement of the transfer region and improvement of the resolution are desired to meet the production of larger capacity chips. The capability of using smaller projection optical system is advantageous with respect to optical performance and cost. Thus, a step-and-scan exposure method is very attractive.

In the step-and-scan method, by controlling the attitude of a wafer with respect to the optical axis direction of a projection optical system during the scan operation, focus adjustment corresponding to a variation in level of the wafer surface within the transfer region can be performed, although it is difficult to do with the simultaneous exposure method. Thus, there may be a larger latitude with respect to surface waviness of a wafer or a pattern step thereon. To this end and in order that the surface of the wafer and the image plane of the projection optical system are best adjusted within the exposure region, it is necessary to use means for successively measuring and controlling the attitude of the wafer surface during the scan exposure process. Regarding such measuring means, to measure the wafer surface at a position spaced from the slit-like exposure region with respect to the scan direction will be advantageous in the point of control, since positional information with respect to the focus direction is produced before a predetermined surface starts to be exposed. However, the measured value is not the one related to the surface being exposed. Thus, if the scan direction on the surface exposed is not perpendicular to the exposure optical axis, the measured value may not be accurate.

Further, in exposure apparatuses which meet 256 M devices, only the focus adjustment corresponding to the surface waviness of the wafer will not assure sufficient resolution.

SUMMARY OF THE INVENTION

It is an object of the present invention to provide a scan exposure apparatus wherein the surface of a substrate at a position spaced, in a scan direction, from a slit-like exposure region, is measured to perform focus adjustment of the substrate surface at the slit position, and wherein a focus error, which may be produced when the scan direction of the surface of a substrate stage, on which the substrate such as a wafer is placed, is not perpendicular to the exposure optical axis, is eliminated.

It is another object of the present invention to provide a scan exposure apparatus by which high precision exposure is assured with a larger latitude.

In accordance with an aspect of the present invention, there is provided a scanning exposure apparatus wherein a portion of a pattern of an original is projected onto a substrate through a projection optical system and wherein the original and the substrate are scanningly moved perpendicular to an optical axis of the projection optical system whereby the pattern of the original is transferred to the substrate, said apparatus comprising: measuring means for measuring a position of the surface of the substrate with respect to an exposure optical axis direction, at a point a predetermined distance before an exposure region of the projection optical system with respect to a scan direction; control means for controlling the position of the surface of the substrate with respect to the exposure optical axis direction on the basis of the result of the measurement; and correction means for correcting the result of the measurement, on the basis of the position of the substrate with respect to a direction along an image plane.

The correction data may be produced by measuring the amount of correction to the position of the substrate with respect to the direction in an image plans beforehand, and it may be memorized as a table or calculation formula.

In a scan exposure apparatus, a measurement point of a focus sensor for measuring the position (focus) of the surface of the substrate to be exposed with respect to the exposure light optical axis position, before the exposure region in the scan direction is placed, and a pre-measurement is made. If the surface of a stage base is distorted by the weight or the effect of machining, an error may be produced as a result of misregistration between the exposure position and the focus measurement point.

The present invention has been made while paying attention to the fact that distortion (deformation) of the base is determined with the position of the stage. A change with the position of the substrate with respect to the scan direction (Z-Y planes) resulting from deformation of the stage base is measured beforehand, and a correction amount with respect to the stage position and the scan direction is prepared in the form of a table or a calculation formula. In the exposure process, the table or calculation formula is used to correct the focus measured value.

This enables correction of focus error resulting from deformation of the stage base.

Thus, in accordance with another aspect of the present invention, there is provided a scanning exposure apparatus wherein a portion of a pattern of an original is projected onto a substrate through a projection optical system and wherein the original and the substrate are scanningly moved perpendicular to an optical axis of the projection optical system whereby the pattern of the original is transferred to the substrate, said apparatus comprising: focusing means for moving a substrate stage, for holding the substrate, in the optical axis direction and a fall (tilt) direction in accordance with a deviation of the original to an object plane of the projection optical system with respect to the optical axis direction and the fall (tilt) direction, attributable to the scan of the original, to thereby bring the substrate into registration with an image plane of the projection optical system.

In a preferred form of this aspect of the present invention, said focusing means includes preparing means for preparing, on the basis of a correction numeral table which uses a current position coordinate of an original stage, for holding the original, as a mediation variable, first a first target value for moving the substrate stage in a focus direction and the fall (tilt) direction. The first target value may be calculated while taking the current position coordinate of the original stage as a parameter.

A scanning exposure apparatus generally includes focus correcting means for sequentially correcting an error of the surface of the substrate, resulting from the scan of the substrate, with respect to the image plane of the projection optical system in the optical axis direction and fall (tilt) direction, by preparing a second target value corresponding to the error and by moving the substrate stage in the optical axis direction and the fall direction. When the present invention is applied to such an apparatus, the second target value may be corrected on the basis of the first target value.

Figure 9:
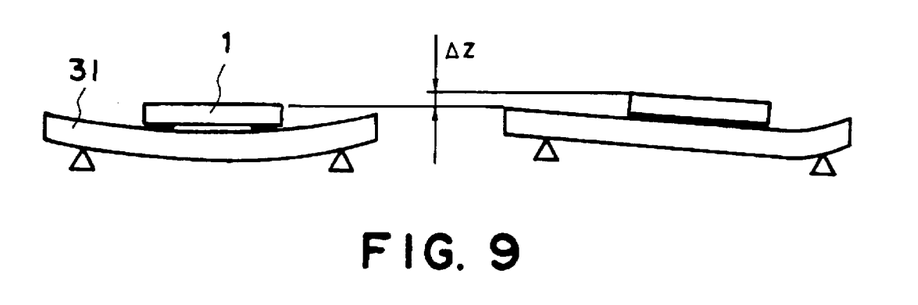
FIG. 9 is a schematic view for explaining, with exaggeration, flexure of a reticle stage base in the apparatus of FIG. 1.

In the scan exposure apparatus, since the reticle stage also performs scan motion, as shown in FIG. 9, the reticle stage base 31 deforms due to the weight of the stage, for example. The amount of such deformation varies in accordance with the position of the reticle stage, as shown at $\Delta z$ in FIG. 9. Therefore, the distance between the reticle surface and the lens changes during the scan. Such a change in distance causes a shift of the imaging point from the wafer surface, and defocus occurs.

The tolerable error of the reticle from the object plane of the projection optical system (depth of focus on the object plans side) is one/(the square of the projection magnification of the projection optical system), as compared with the depth of focus on the wafer side. Thus, if the projection magnification is ¼, the depth of focus on the object plane side is 16 times the depth of focus on the wafer side. Under the condition that the depth of focus on the wafer side is 5 microns, the depth of focus on the object plane side is 80 microns. Thus, flexure of the reticle stage base of about a few microns can be disregarded.

However, in an exposure apparatus usable for the manufacture of 256 M devices, the depth of focus on the wafer side will be about 0.8 micron and, thus, the depth of focus on the object plane side will be about 13 microns. If the reticle base has a rigidity similar to that of the reticle base used in conventional scan exposure apparatuses, this would not be sufficient in consideration of a focus error on the wafer side or flexure of a base due to the weight of the reticle stage, for example.

In accordance with the present invention, a change of the reticle surface in the optical axis direction or fall direction resulting from a scan of the reticle can be corrected. Thus, the latitude for focus adjustment can be increased, and defocus can be prevented with ease. Further, since the attitude of the reticle or the position thereof with respect to the optical axis direction is corrected on the wafer side, it is not necessary to provide a Z-tilt correction stage on the reticle side. Thus, unwanted increases in weight or size of the reticle as wall as increases in the cost of the apparatus or load to the reticle base and scan drive system can be prevented.

Since displacement of the reticle stage, that is, flexure of the reticle stage base is determined in accordance with the position of the reticle stage, a correction target value with respect to the optical axis direction and the fell direction may be determined on the basis of a correction numeral table, using the current position coordinate of the reticle stage as a mediation variable, or of a calculation using the current position coordinate of the reticle stage as a parameter.

This enables correction of focus error attributable to deformation of the reticle stage base efficiently.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
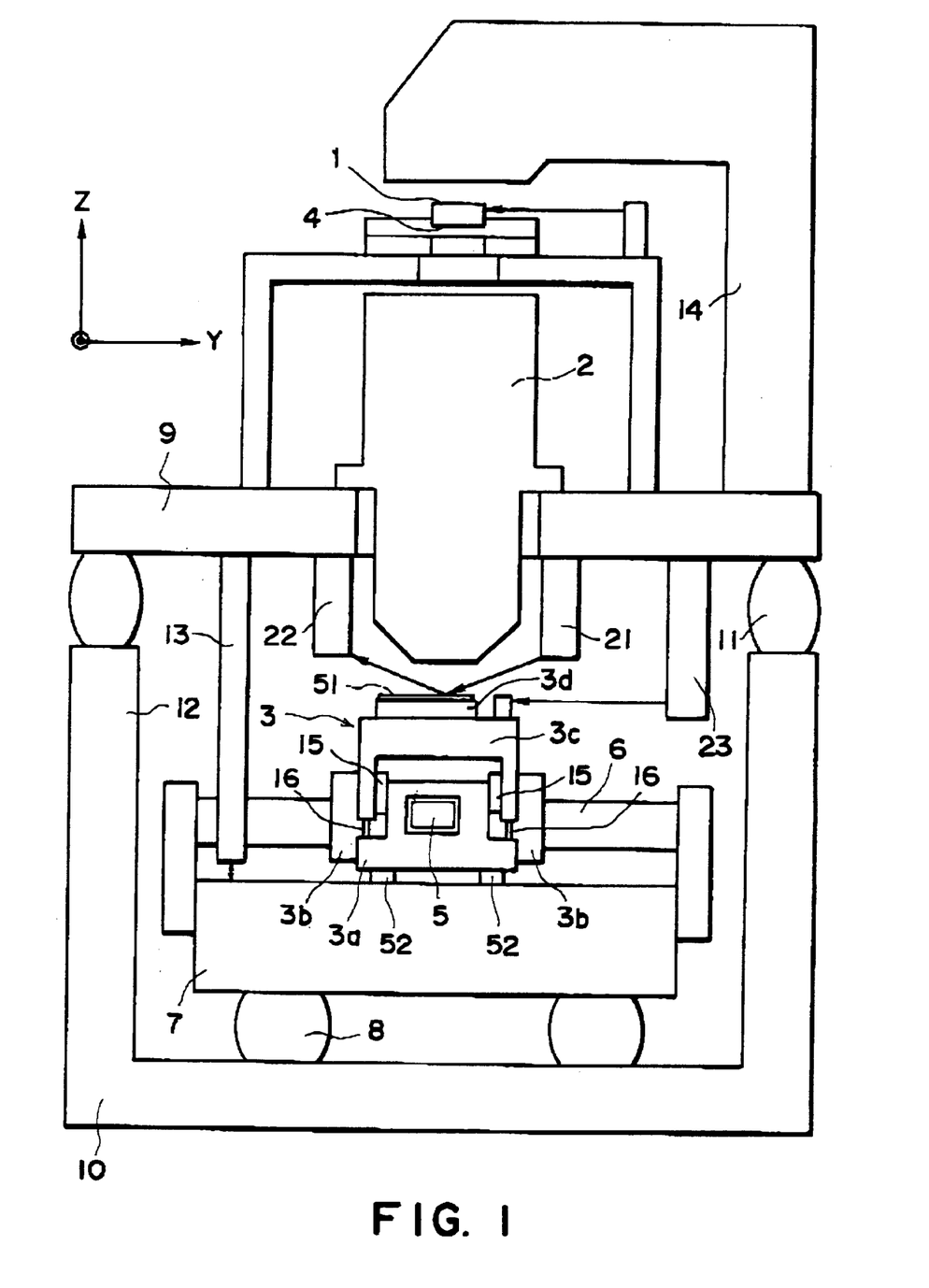
FIG. 1 is a schematic and side view of an exposure apparatus according to an embodiment of the present invention.
Figure 2:
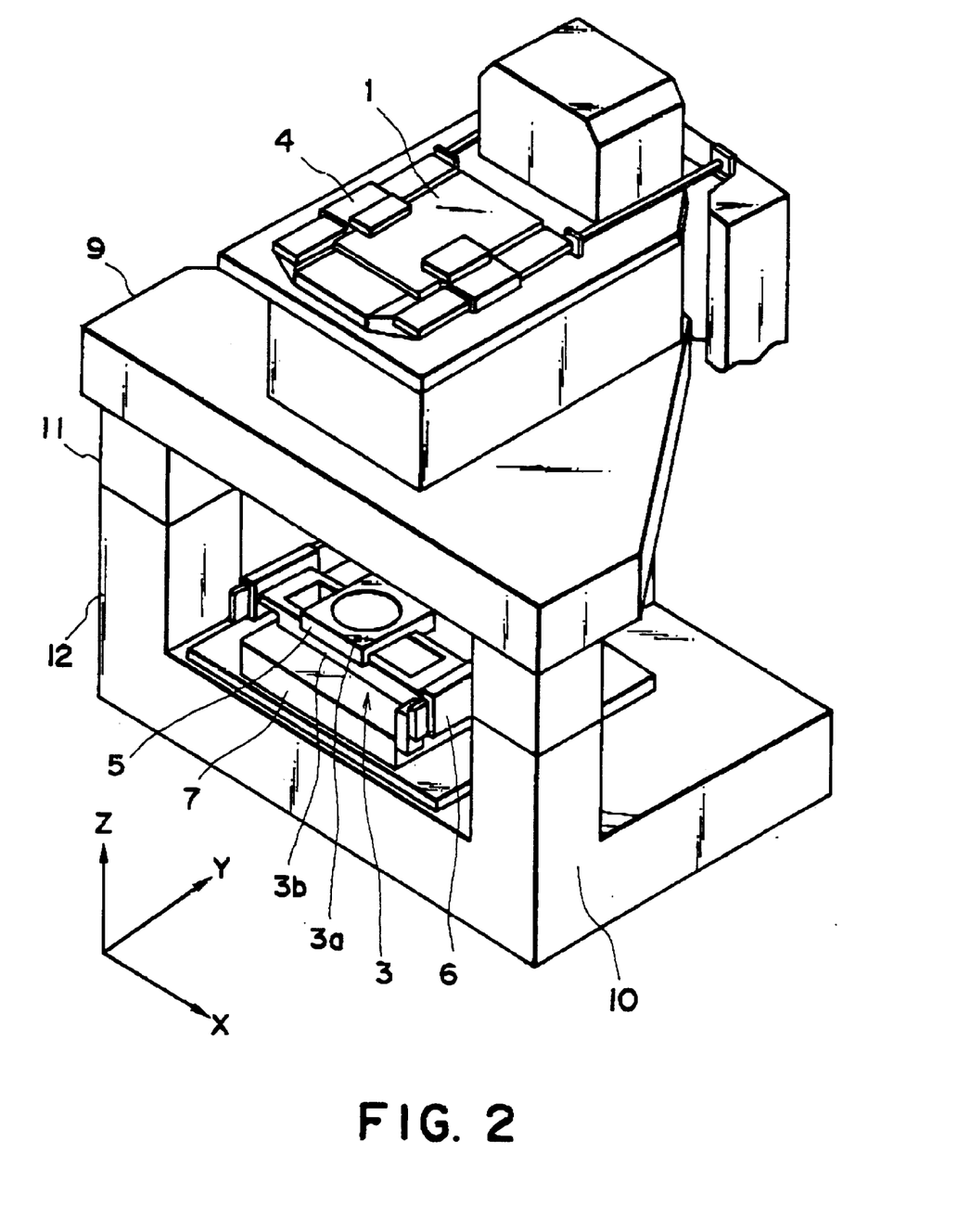
FIG. 2 is a perspective view of the exposure apparatus of FIG. 1.

Preferred embodiments of the present invention will be described with reference to the drawings. FIG. 1 is a schematic and side view of an exposure apparatus according to an embodiment of the present invention. FIG. 2 is a perspective view of the apparatus. As shown in these drawings, the exposure apparatus comprises a step-and-scan type exposure apparatus wherein a portion of a pattern of an original placed on a reticle stage 1 is projected onto a wafer 51 placed on a wafer stage through a projection optical system 2, wherein the reticle and the wafer are relatively and scanningly moved in the Y direction relative to the projection optical system 2, whereby the pattern of the reticle is transferred to the wafer, and wherein there is stepwise motion interposed to cause repetition of such a scan exposure to plural transfer regions (shots) on the wafer.

The reticle stage 1 can be moved in the Y direction by a linear motor 4, along the X-Y plane perpendicular to the optical axis direction (Z direction) of a projection optical system 2. The wafer stage 3 (3a–3d) comprises an X stage 3a which can be moved in the X direction by a linear motor 5. The wafer stage further comprises a Y stage 3b on which the linear motor 5 is mounted. The Y stage 3b can be moved in the Y direction by a linear motor 6. A synchronized scan of the reticle and the wafer is performed by moving the reticle stage 1 and the Y stage 3b in the Y direction at a predetermined speed ratio (e.g., 4:−1 where the sign "−" represents that the direction is inverse). On the X stage 3a, there is a Z-tilt stage 3c mounted. A wafer chuck 3d for holding the wafer 51 is mounted on the Z-tilt stage. The X stage 3a is guided along a stage base 7, in the X direction by means of air-bearing means 52, while it is confined with respect to the Z direction. The Z-tilt stage 3c can be moved in the Z-tilt direction, relative to the X stage 3a, by means of plural linear motors 15. Between the Z-tilt stage 3c and the X stage 3a; there is a sensor 16 which serves to measure the relative position of them with respect to the Z-tilt direction.

The wafer stage 3 is mounted on the stage base 7 which is supported by the floor, for example, at three points and through three dampers. The reticle stage 1, the projection optical system 2 and an illumination system 14 are mounted on a barrel base 9 which is supported by a base frame 10 mounted on the floor, for example, through three dampers 11 and pillars 12. Each damper 6 comprises an active damper for active vibration control or vibration isolation in six-axis directions. However, it may comprise a passive damper. Alternatively, the mechanism may be supported without such a damper.

The exposure apparatus further includes distance measuring leans 13 such as a laser interferometar, or micro-encoder, for example, which is adapted to measure the distance between the barrel base 9 and the stage base 7 in the Z direction at three points.

Light projecting means 21 and light receiving means 22 provide a focus sensor for detecting whether a wafer on the wafer stage 3 is placed on the focus plane of the projection optical system 2 or not. More specifically, the light projecting means 21 fixed to the barrel base 9 projects light onto the wafer in a oblique direction, and the light receiving means 22 detects the position of reflection light from the wafer to thereby detect the position of the wafer surface with respect to the optical axis direction (Z direction) of the projection optical system 2.

In operation with the structure described above, by conveying means (not shown), a wafer is conveyed along a conveyance path between two pillars 12 in the front portion of the apparatus. After completion of a predetermined alignment operation, the exposure apparatus performs transfer of the pattern of the reticle to plural transfer regions on the wafer while repeating scan exposure and stepwise motion. For the scan exposure, the reticle stage 1 and the Y stage 3b are moved in the Y direction (scan direction) at a predetermined speed ratio so that the pattern of the reticle is scanned with slit-like exposure light and also the wafer is scanned with the projected image thereof. By this, the pattern of the reticle is transferred to a particular transfer region on the wafer. During the scan exposure process, the height (level) of the wafer surface is measured by the focus sensor described above, and, on the basis of the measured value, the height (position in the Z direction) aid tilt (inclination with respect to X-Y plane) of the wafer stage 3 are real-time controlled to execute focus correction. After scan exposure of one transfer region is completed, the X stage 3a and/or the Y stage 3b is driven to move the wafer stepwise in the X and/or Y direction to thereby place another transfer region at the scan exposure start position. Then, the scan exposure is performed. The layout of transfer regions, the scan direction (positive or negative) and the order of exposures of the transfer regions, for example, are so determined that, with the combination of stepwise motion in the X and Y directions and Y-direction movement for scan exposure, exposures can be done efficiently to plural transfer regions on the wafer.

Figure 3:
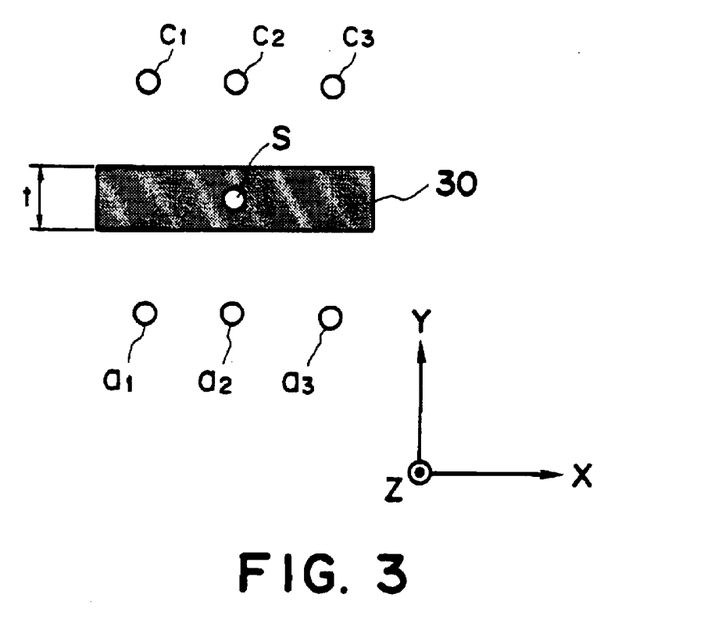
FIG. 3 is a schematic view for explaining the disposition of focus sensor means in the apparatus of FIG. 1.
Figure 4:
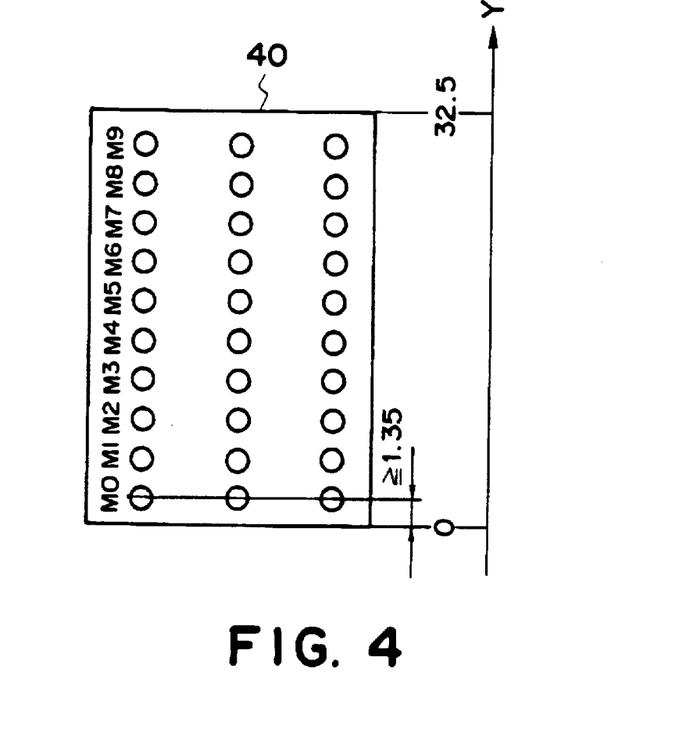
FIG. 4 is a schematic view for explaining focus measurement points within a shot, in the apparatus of FIG. 1.

FIG. 3 illustrates a positional relationship between a slit projected on the wafer by the projection optical system 2 and focus measurement points (spots) by the focus sensor. FIG. 4 illustrates focus measurement objective points on the wafer. In the apparatus of this embodiment, the exposure slit 30 has a size of 7×25 mm, and the largest size of the transfer region 40 is 25×32.5 mm. As regards the spots, there are one spot at the center of the exposure slit 30 and a pair of three spots at positions shifted each by 12 mm from the center of the exposure slit 30 in the scan direction. Thus, there are seven spots in total. When the wafer is to be scanned from the below to the above as viewed in the drawing (upward scan), three channels of spots a1, a2 and a3 are used, while on the other hand, when the wafer is to be scanned from above to below (downward scan), three channels of spots c1, c2 and c3 are also used for measuring the height (position in the Z direction) of the wafer. For each spot, measurement is made with respect to ten points (M0–M9) in the wafer measurement direction. Measured data thus obtained is used thereafter as focus correction data when, in a succeeding scan operation, each of the measurement points M0–M9 comes to the center of the exposure slit 30. Thus, the focus correction is performed on the basis of focus pre-measurement at each measurement point. Spot S is an acquisition measurement spot on the slit.

Figure 5A:
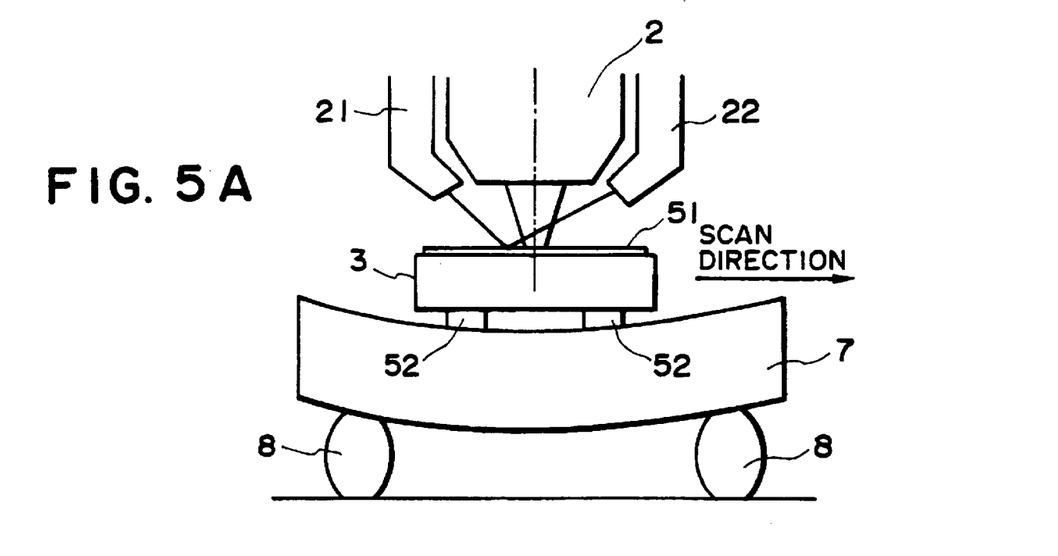
FIGS. 5A, 5B and 5C are schematic views, respectively, or explaining, with exaggeration, flexure of a stage base of the apparatus of FIG. 1.
Figure 5B:
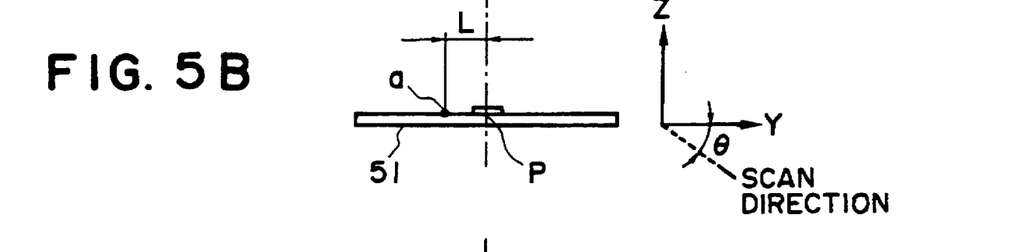
Figure 5C:
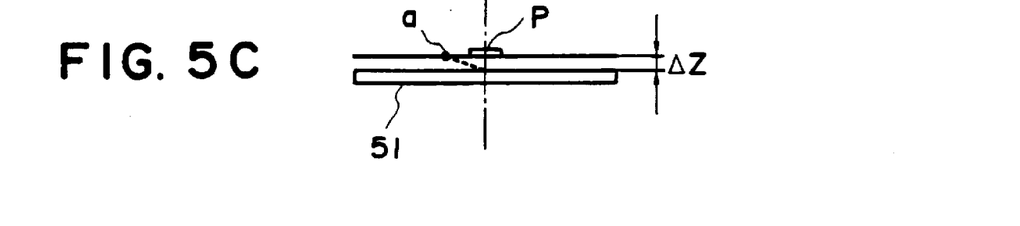

As shown in FIG. 5A, due to the weight or surface precision during machining, there may be caused flexure of the stage base 7. On that occasion, there occurs tilt θ in the scan direction of the wafer stage 3 within the optical axis plane (Y-Z plane) from the Y direction, such as shown in FIG. 5B. Regarding the wafer surface at a pre-measurement point a, if the scan is made while the wafer height with respect to the wafer stage 3 is held constant, there arises a deviation ΔZ at the slit position P spaced from the pre-measurement point a by L. Namely, the measured value at the pre-measurement point a contains, without any correction, an error ΔZ=Lθ, which is called Abbe's error. In FIGS. 5A–5C, denoted at 51 is a wafer, and denoted at 52 is an air bearing.

The flexure by weight of the stage base 7 can be measured in every apparatus and, also, the amount of flexure is determined by the position of the wafer stage 3, for example. In consideration of this, in this embodiment, a table of correction values with X and Y positions of the wafer stage 3 is prepared beforehand. During the scan exposure operation, the measured values of the focus sensor (21 and 22) are corrected and, on the basis of the thus corrected values, the wafer stage 3 is driven in the Z direction to perform wafer surface position correction (focus correction). With this procedure, a focus error attributable to misregistration occurs between the focus measurement point (spot) end the focus correction (slit) position, resulting from deformation of the stage base 7. It is to be noted that the correction value described above is a value for correcting an error, of the X and Y position of the wafer stage 3 being scanned from the focus measurement point to the slit, and it varies with the scan direction.

Figure 6A:
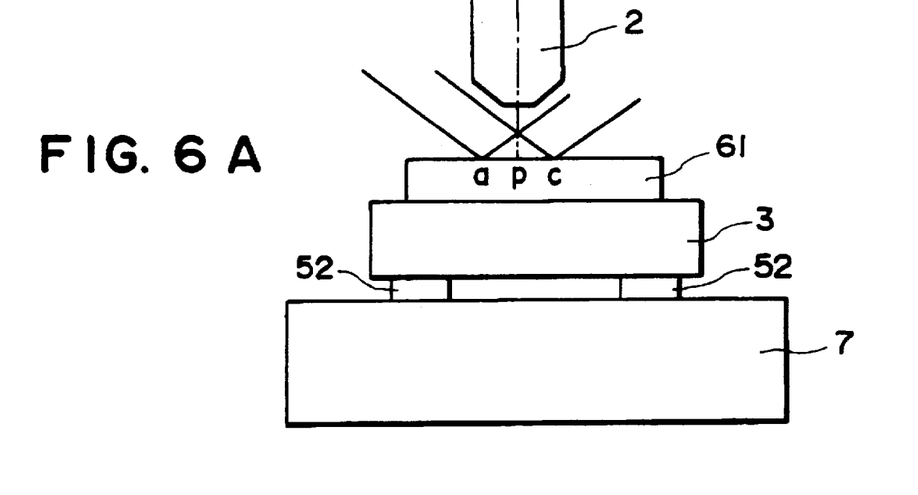
FIGS. 6A and 6B are schematic views for explaining the manner of producing a focus measurement correction value, in the apparatus of FIG. 1.
Figure 6B:
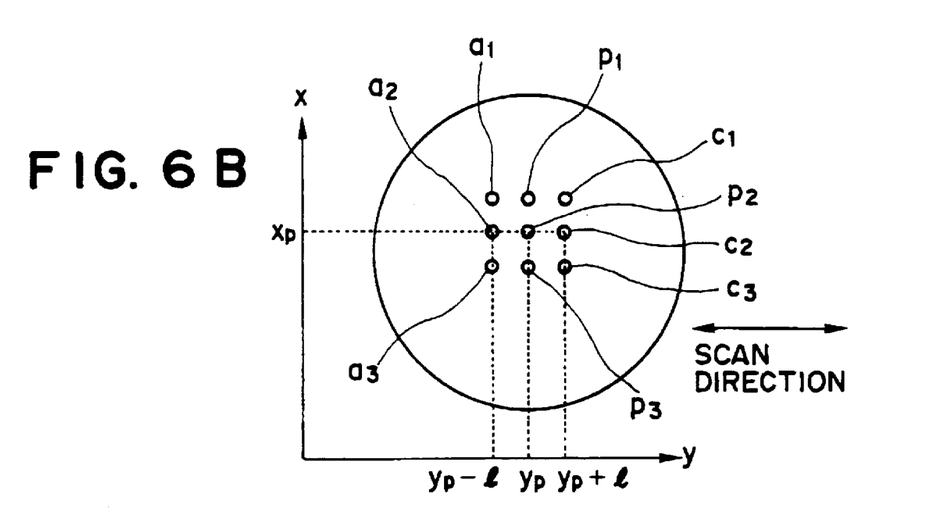

The manner of preparing the correction value table will be described with reference to FIG. 6. Here, in this embodiment, in consideration of the applicability to the manufacture of 256 M devices, it is assumed that the tolerable depth of focus of the projection optical system is 0.8 micron, the measurement precision of the distance measuring means is 0.1 micron, the target precision of the stage is 0.1 micron, and the target precision of the focus correction is 0.2 micron.

First, a reference member 61, with a reference surface having a sufficiently high flatness of 20–30 nm order, is mounted on the wafer stage 3 in place of the wafer chuck. This reference member 61 has a thickness larger than that of the wafer chuck, by the thickness of the wafer. Then, the wafer stage 3 is moved in the X and Y directions so that a predetermined position $P(x_p, y_p)$ on the reference member 61 is placed at the center of the exposure lens (projection optical system) 2, where $x_p$ and $y_p$ are on a coordinate system of the wafer stage 3. At this position, the surface position measurement is made at seven spots a1, a2, a3, S(p2), c1, c2 and c3 by using the focus sensor. While doing this, the wafer stage 3 is moved to perform Z-tilt motion, so that the surface of the reference member 61 is brought into registration with a reference plane (exposure plane). Subsequently, from that position, while controlling the Z-tilt system so that the measured value of the sensor 16 becomes constant (stage base reference mode), the wafer stage 3 is moved in the scan direction by a pre-measurement distance L. Namely, point P is moved to the position $(x_p, y_p+L)$, and points p1, p2 and p3 are displaced to the positions of the spots c1, c2 and c3. The measured values obtained at the spots c1, c2 and c3 through the focus sensor provide correction values for pre-measured values at point P (p1, p2 and p3) produced with the spots c1, c2 and c3 when the scan exposure is in the negative Y direction (downward scan). It is to be noted here that a change in the measured value of the focus sensor attributable to a relative attitude variation between the stage base 7 and the barrel base 9, which is obtainable from the measured value of the distance measuring means 13, has to be corrected. By the correction, only the effect of the change due to flatness of the stage base 7 or to distortion by loads can be extracted.

Also, the sensor measured values at spots a1, a2 and a3 produced as the point P is displaced to the position $(x_p, y_p-L)$ provide correction values for the scan movement in the +Y direction (upward scan).

By setting such a point $P(x_p, y_p)$ at many points throughout the whole wafer surface to obtain a number of correction values, a correction table for $(x_p, y_p)$ versus correction value is prepared. Here, preferably, it may include correction values taken with respect to point P, at least of a number corresponding to the spatial frequency of the waviness of the wafer stage. In place of using a correction table, correction values may be expressed in terms of a function $F(x_p, y_p)$.

By using the thus obtained correction values, the focus measured value during scan exposure is corrected. On the basis of the thus corrected focus measured value, the Z-tilt system of the wafer stage 3 is controlled to execute the focus correction. It has been confirmed that, as a result of this, even irrespective of a largest stage waviness of 0.2 (micron)/ 12 (mm), a substantial focus error could not be found.

Figure 7:
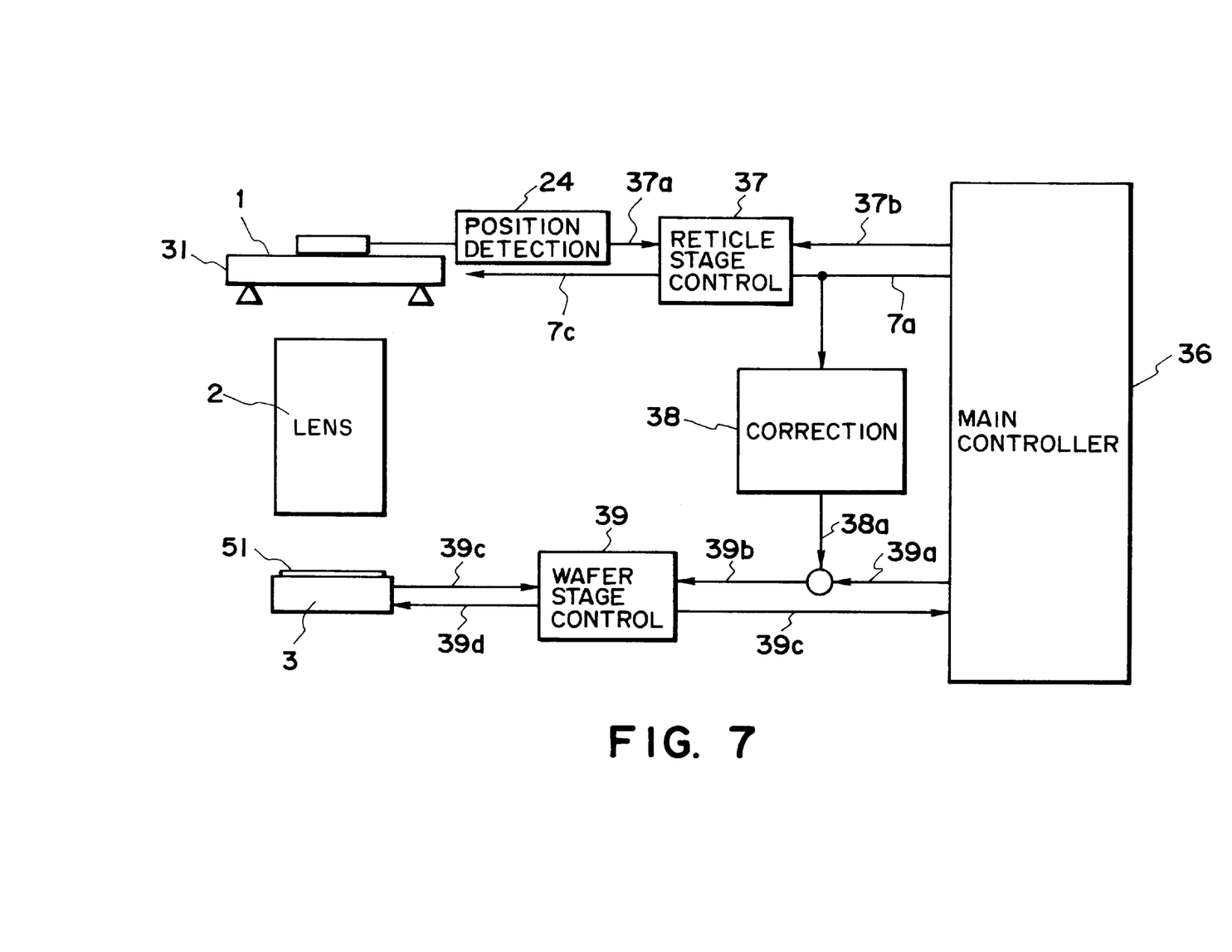
FIG. 7 is a block diagram of a control system of the apparatus of FIG. 1.

FIG. 7 is a block diagram of the control system for the apparatus of FIG. 1. In this drawing, the reticle stage 1 is guided so as to be moved in the scan direction along the reticle stage base 31, and the scan motion is provided by an actuator, not shown. The wafer 51 is placed on the wafer stage 3, and it is scanned in synchronism with the reticle stage 1 whereby the pattern of the reticle is transferred to the wafer with exposure light passing through the lens 2. The reticle stage base 31, the wafer stage 3 and the lens 2 are supported by a structure, not shown.

Main controller 36 is a device for controlling the exposure apparatus as a whole. Reticle stage controller 37 supplies an instruction signal 37c to the reticle stage actuator on the basis of a reticle stage position signal 37a, detected by a reticle stage position detecting system 24, and of a signal 37b from the main controller 36. In response, the reticle stage 1 is driven in the Y direction to perform the scan in synchronism with the wafer stage 3.

Correction device 38 produces a correction signal 38a in response to the reticle stage position signal 37a and on the basis of a correction numeral table prepared beforehand and taking the reticle stage position as the mediation variable.

Wafer stage control system 39 supplies a signal 39d to a wafer stage actuator, not shown, on the basis of a safer stage position signal 39c from a wafer stage position detecting system, not shown, of a signal 39a from the main controller, and of a correction signal 38a from the correcting device 38. In response, the wafer stage 3 is driven in the Y direction to perform the scan in synchronism with the reticle stage 1. Also, it is driven in the Z direction (optical axis direction) and tilt direction (fall direction) in accordance with the correction value.

Figure 8:
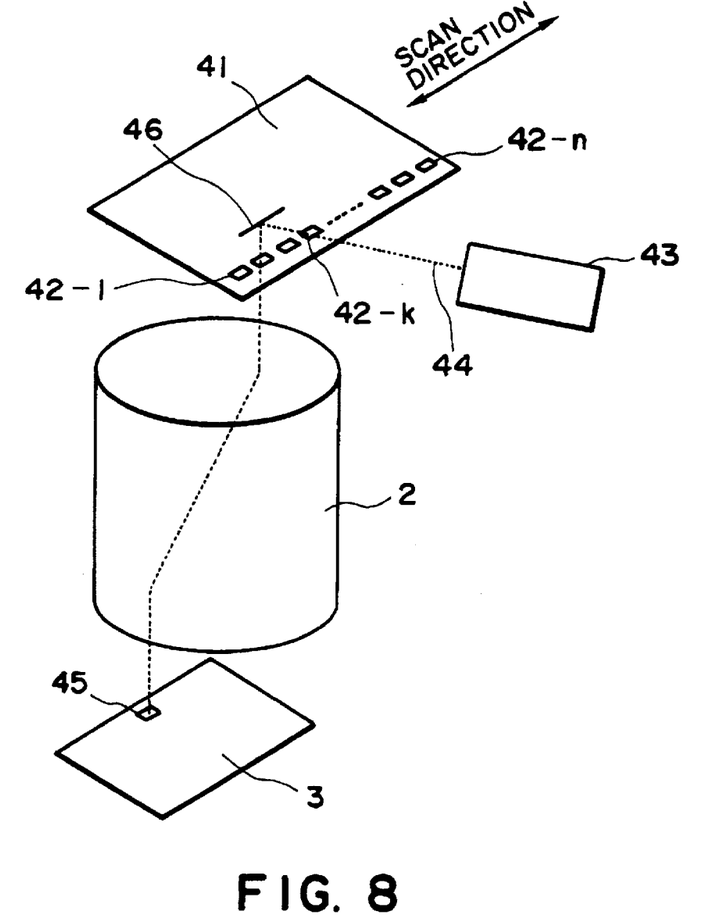
FIG. 8 is a schematic view for explaining the preparation of a correction numeral table, in the apparatus of FIG. 1.

Next, the manner of preparing the correction numeral table will be described. A first example will now be explained. In FIG. 8, denoted at 41 is a test reticle on which alignment marks 42 (42-1 to 42-n) for preparation of a correction numeral table are provided. Denoted at 43 is an alignment optical system device (TTR scope) which comprises a light source for alignment light 44 of substantially the same wavelength as that of the exposure light, and sensor means for detecting the quantity of incidence light and reflection light. The alignment light 44 passes through the lens 2, and the alignment mark 42 on the reticle as well as a reference mark 45 on the wafer stage 3 are observed. It is now assumed that the alignment optical system observes an alignment mark 42-k, and the position in the Z direction and tilt of the wafer stage 3 are changed minutely. In response, the quantity of reflection light of the alignment light changes. The Z-tilt position corresponding to the largest change in light quantity corresponds to the best local point position of the water stage 3. Since the reticle mark 42-k is determined by the position of the reticle stage 1, the reticle stage 1 may be moved sequentially and the best focal point position of each reticle mark 42 may be detected. By this, a desired correction numeral table can be produced. Denoted at 46 is a mirrors.

Another example of a preparation method is based on actual wafer exposure. While holding the reticle stage 1 fixed at a certain position, the Z-tilt of the wafer stage 3 is changed and exposure of plural wafers is made. From the result of exposure, the wafer having been at the best focal point position is determined, and the position of the wafer 3 corresponding to it is detected. Then, the reticle stage 1 is moved sequentially, and in a similar manner, a desired correction numeral table is prepared.

In the embodiment described above, a correction signal 38a for Z-tilt drive of the wafer stage 3 is produced on the basis of a correction numeral table prepared beforehand. However, such a signal 38a may be produced by calculation. On that occasion, in place of the correction device 38 of FIG. 7, a computing device, which is adapted to use the reticle stage position signal 37*a* as a parameter and produce a correction signal 38*a* as an output, may be used.

In the computing device, a value of the correction numeral table determined in a similar way as in the preceding embodiment may be used while approximating it with a function having the reticle stage position as a parameter, and a correction signal may be produced on the basis of this function.

Figure 10:
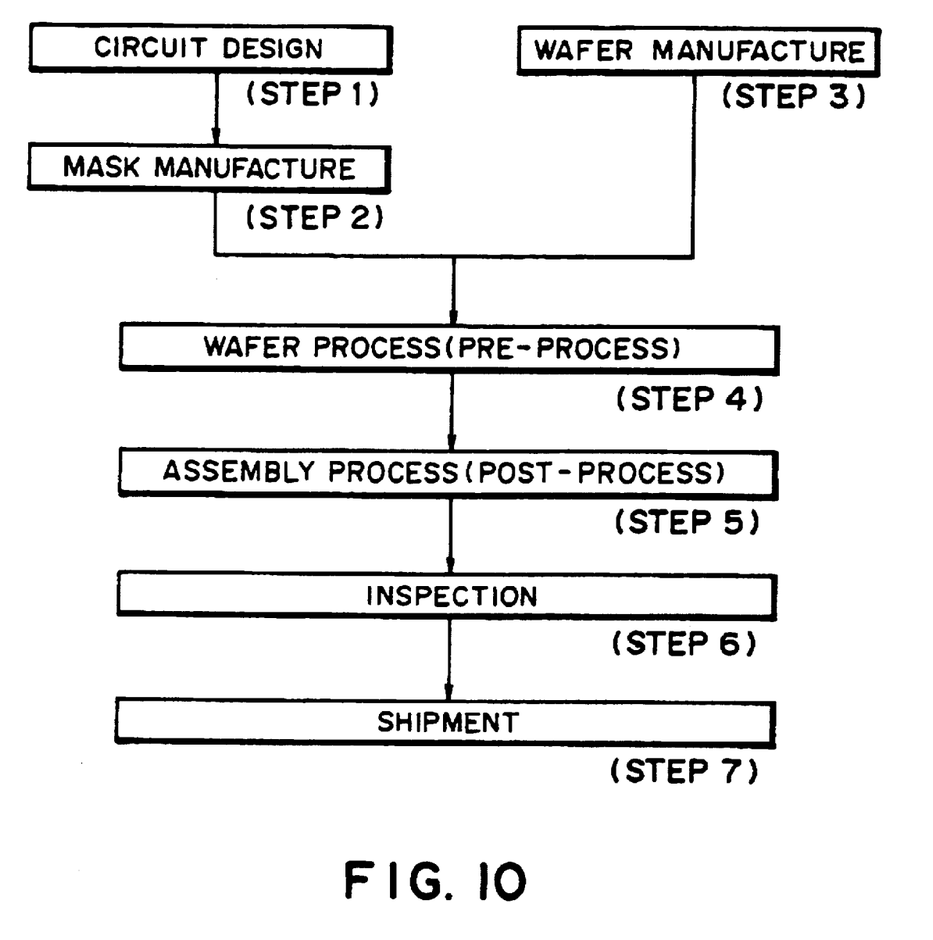
FIG. 10 is a flow chart of microdevice manufacturing processes.

FIG. 10 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 11:
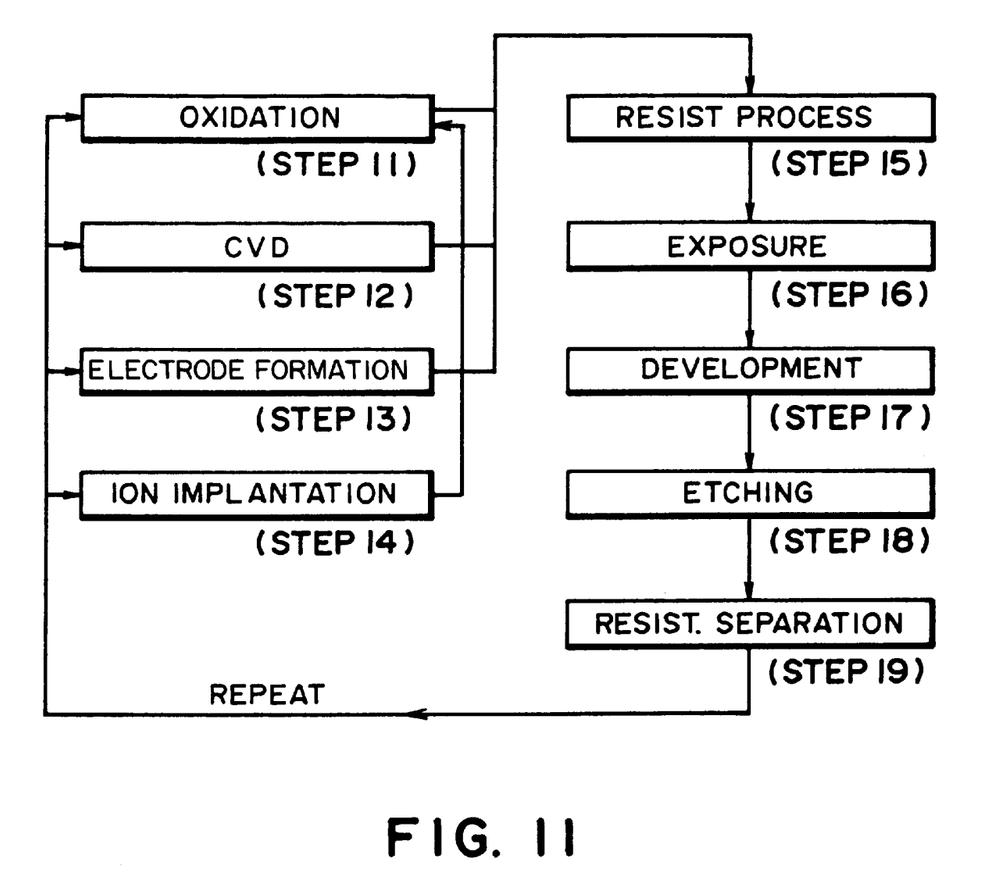
FIG. 11 is a flow chart for explaining details of a wafer process in the procedure of FIG. 10.

FIG. 11 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A scan type exposure apparatus comprising:
   a projection optical system for projecting, at a projection station, a portion of a pattern of an original onto a region on a substrate;
   an original stage for moving the original relative to said projection optical system in an original scanning direction;
   a first substrate stage for moving the substrate relative to said projection optical system in a substrate scanning direction;
   a second substrate stage for moving the substrate relative to said projection optical system in an optical axis direction of said projection optical system;
   synchronism control means for controlling, in the projection of the original pattern onto the substrate through said projection optical system, synchronism between the movement of said original stage in the original scanning direction and the movement of said first substrate stage in the substrate scanning direction;
   measuring means for measuring a position of the surface of the substrate with respect to the optical axis direction of said projection optical system, at a measurement point spaced from the projection station of said projection optical system by a predetermined distance along the substrate scanning direction; and
   stage control means for controlling, in the control of the synchronism between the movement of said original stage and the movement of said first substrate stage through said synchronism control means, movement of the substrate through said second substrate stage on the basis of a measured value of said measuring means and of a correction value for correcting an error produced with movement of said first substrate stage from the measurement point to the projection station over a portion of the substrate to be measured.

2. An apparatus according to claim 1, wherein said second substrate stage adjusts the attitude of the surface of the substrate with respect to an image plane of said projection optical system, and said stage control means adjusts the attitude of the substrate surface through said second substrate stage on the basis of the measured value and the correction value.

3. An apparatus according to claim 1, wherein the correction value is changeable in accordance with the position of said first substrate stage along a plane containing the substrate scanning direction.

4. An apparatus according to claim 3, wherein the correction value is detected beforehand with respect to each of different positions of said first substrate stage, and said apparatus further comprises storing means for storing correction values related to the different positions, respectively.

5. An apparatus according to claim 3, wherein the correction value is determined on the basis of a calculation using a correction function.

6. A scan type exposure apparatus comprising:
   a projection optical system for projecting a portion of a pattern of an original onto a region on a substrate;
   an original stage for moving the original relative to said projection optical system in an original scanning direction;
   a first substrate stage for moving the substrate relative to said projection optical system in a substrate scanning direction;
   a second substrate stage for moving the substrate relative to said projection optical system in an optical axis direction of said projection optical system;
   synchronism control means for controlling, in the projection of the original pattern onto the substrate through said projection optical system, synchronism between the movement of said original stage in the original scanning direction and the movement of said first substrate stage in the substrate scanning direction; and
   stage control means for controlling, in the control of the synchronism between the movement of said original stage and the movement of said first substrate stage through said synchronism control means, movement of the substrate through said second substrate stage on the basis of a correction value for correcting an error produced with the position of said original stage with respect to the plane containing the original scanning direction.

7. An apparatus according to claim 6, wherein said second substrate stage adjusts the attitude of the surface of the substrate with respect to an image plane of said projection optical system, and said stage control means adjusts the attitude of the substrate surface through said second substrate stage on the basis of the correction value.

8. An apparatus according to claim 6, wherein the error contains at least one of a component of the original with respect to the optical axis direction of said projection optical system and a component of tilt with respect to said projection optical system.

9. An apparatus according to claim 6, wherein the correction value is detected beforehand with respect to each of different positions of said original stage, and said apparatus further comprises storing means for storing correction values related to the different positions, respectively.

10. An apparatus according to claim 6, wherein the correction value is determined on the basis of a calculation using a correction function.

11. A scan type exposure method comprising:

projecting, with a projection optical system, at a projection station, a portion of a pattern of an original onto a region on a substrate;

moving, with an original stage, the original relative to the projection optical system in an original scanning direction;

moving, with a first substrate stage, the substrate relative to the projection optical system in a substrate scanning direction;

moving, with a second substrate stage, the substrate relative to the projection optical system in an optical axis direction of the projection optical system;

controlling, with a synchronism controller, in the projection of the original pattern onto the substrate through the projection optical system, synchronism between the movement of the original stage in the original scanning direction and the movement of the first substrate stage in the substrate scanning direction;

measuring, with measuring means, a position of the surface of the substrate with respect to the optical axis direction of the projection optical system, at a measurement point spaced from the projection station of the projection optical system by a predetermined distance along the substrate scanning direction; and controlling, with a stage controller, in the control of the synchronism between the movement of the original stage and the movement of the first substrate stage through the synchronism controller, movement of the substrate through the second substrate stage on the basis of a measured value of the measuring means and of a correction value for correcting an error produced with movement of the first substrate stage from the measurement point to the projection station over a portion of the substrate to be measured.

12. A method according to claim 11, further comprising adjusting, with the second substrate stage, the attitude of the surface of the substrate with respect to an image plane of the projection optical system, and controlling, with the stage controller, the attitude of the substrate surface through the second substrate stage on the basis of the measured value and the correction value.

13. A method according to claim 11, wherein the correction value is changeable in accordance with the position of the first substrate stage along a plane containing the substrate scanning direction.

14. A method according to claim 13, further comprising detecting the correction value beforehand, with respect to each of different positions of the first substrate stage, and further comprising storing, with storing means, correction values related to the different positions, respectively.

15. A method according to claim 13, further comprising determining the correction value on the basis of a calculation using a correction function.

16. A scan type exposure method comprising:

projecting, with a projection optical system, a portion of a pattern of an original onto a region on a substrate;

moving, with an original stage, the original relative to the projection optical system in an original scanning direction;

moving, with a first substrate stage, the substrate relative to the projection optical system in a substrate scanning direction;

moving, with a second substrate stage, the substrate relative to the projection optical system in an optical axis direction of the projection optical system;

controlling, with a synchronism controller, in the projection of the original pattern onto the substrate through the projection optical system, synchronism between the movement of the original stage in the original scanning direction and the movement of the first substrate stage in the substrate scanning direction; and controlling, with a stage controller, in the control of the synchronism between the movement of the original stage and the movement of the first substrate stage through the synchronism controller, movement of the substrate through the second substrate stage on the basis of a correction value for correcting an error produced with the position of the original stage with respect to the plane containing the original scanning direction.

17. A method according to claim 16, further comprising adjusting, with the second substrate stage, the attitude of the surface of the substrate with respect to an image plane of the projection optical system, and adjusting, with the stage controller, the attitude of the substrate surface through the second substrate stage on the basis of the correction value.

18. A method according to claim 16, wherein the error contains at least one of a component of the original with respect to the optical axis direction of the projection optical system and a component of tilt with respect to the projection optical system.

19. A method according to claim 16, further comprising detecting the correction value beforehand with respect to each of different positions of the original stage, and further comprising storing, with storing means, correction values related to the different positions, respectively.

20. A method according to claim 16, further comprising determining the correction value on the basis of a calculation using a correction function.

* * * * *

UNITED STATES PATENT AND TRADEMARK OFFICE
CERTIFICATE OF CORRECTION

PATENT NO. : 5,917,580

DATED : June 29, 1999

INVENTOR(S): RYUICHI EBINUMA, ET AL.

It is certified that error appears in the above-identified patent and that said Letters Patent is hereby corrected as shown below:

COLUMN 1,
Line 41, "smaller" should read --a smaller--.

COLUMN 2,
Line 39, "plans" should read --plane--; and
Line 54, "(Z-Y planes)" should read --(Z-Y plane)--.

COLUMN 3,
Line 15, "first" (1st occurrence) should be deleted; and
Line 31, "scan" should read --a scan--.

COLUMN 4,
Line 8, "fell" should read --fall--; and
Line 33, "or" should read --for--.

COLUMN 5,
Line 34, leans" should read --means--; and "interferometar, or" should read --interferometer, or a--;
Line 43, "a" should read --an--; and
Line 66, "X-Y" should read --the X-Y--.

UNITED STATES PATENT AND TRADEMARK OFFICE
CERTIFICATE OF CORRECTION

PATENT NO. : 5,917,580

DATED : June 29, 1999

INVENTOR(S): RYUICHI EBINUMA, ET AL.

It is certified that error appears in the above-identified patent and that said Letters Patent is hereby corrected as shown below:

<u>COLUMN 6</u>,
Line 5, "of" should read --for--;
Line 22, "the" (1st and 2nd occurrences) should be deleted; and
Line 62, "end" should read --and--.

<u>COLUMN 8</u>,
Line 17, "the" (2nd occurrence) should read --a--;
Line 19, "safer" should read --wafer--; and
Line 51, "mirrors." should read --mirror.--.

Signed and Sealed this

Ninth Day of May, 2000

Attest:

Q. TODD DICKINSON

*Attesting Officer*     *Director of Patents and Trademarks*